(12) United States Patent
Chen et al.

(10) Patent No.: US 12,363,828 B2
(45) Date of Patent: Jul. 15, 2025

(54) ELECTRONIC DEVICE

(71) Applicant: SAMSUNG ELECTRONICS CO., LTD., Suwon-si (KR)

(72) Inventors: Peiyu Chen, Suzhou (CN); Wenri Liu, Suzhou (CN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 18/230,979

(22) Filed: Aug. 7, 2023

(65) Prior Publication Data

US 2023/0413438 A1 Dec. 21, 2023

Related U.S. Application Data

(63) Continuation of application No. PCT/KR2023/006316, filed on May 10, 2023.

(30) Foreign Application Priority Data

May 13, 2022 (CN) .......................... 202210520692.7

(51) Int. Cl.
*H05K 1/14* (2006.01)
*H05K 1/18* (2006.01)
*H05K 5/00* (2006.01)

(52) U.S. Cl.
CPC ............... *H05K 1/14* (2013.01); *H05K 1/181* (2013.01); *H05K 5/006* (2013.01)

(58) Field of Classification Search
CPC ........... H05K 1/14; H05K 1/181; H05K 5/006
See application file for complete search history.

(56) References Cited

U.S. PATENT DOCUMENTS

| 5,027,256 A | 6/1991 | Abnoosi et al. |
| 7,924,575 B2 | 4/2011 | Murakami |
| (Continued) | | |

FOREIGN PATENT DOCUMENTS

| CN | 204407577 U | 6/2015 |
| CN | 207184915 U | 4/2018 |
| (Continued) | | |

OTHER PUBLICATIONS

Office Action issued on Apr. 3, 2024 by the Chinese Patent Office in corresponding CN Patent Application No. 202210520692.7.
(Continued)

*Primary Examiner* — Paresh Paghadal
(74) *Attorney, Agent, or Firm* — Sughrue Mion, PLLC (57) ABSTRACT

Disclosed is an electronic device including an upper housing and a lower housing, a first circuit board, a second circuit board, and a supporting member connected between the first circuit board and the second circuit board being provided between the upper housing and the lower housing. The supporting member has a first installation surface, a second installation surface, and a bending portion connected between the first installation surface and the second installation surface. The first installation surface is located below the second installation surface and the first circuit board is provided on the first installation surface. A connecting part is provided on the first circuit board, the first circuit board is fixed to the first installation surface by the connecting part, the second circuit board is fixed to the second installation surface, the lower housing is connected with the connecting part.

15 Claims, 6 Drawing Sheets

(56) References Cited

U.S. PATENT DOCUMENTS

| | | |
|---|---|---|
| 8,154,838 B2 | 4/2012 | Jang et al. |
| 8,582,270 B2 | 11/2013 | Jang et al. |
| 9,807,880 B2 | 10/2017 | Park et al. |
| 11,264,700 B2 | 3/2022 | Jeon et al. |
| 2009/0122455 A1 | 5/2009 | Jang et al. |
| 2012/0160552 A1 | 6/2012 | Jang et al. |
| 2012/0320286 A1 | 12/2012 | Shimizu et al. |
| 2015/0003108 A1 | 1/2015 | Park et al. |
| 2017/0020490 A1* | 1/2017 | Ryu ............... A61B 8/4427 |
| 2018/0255659 A1 | 9/2018 | Harrer et al. |
| 2020/0203802 A1 | 6/2020 | Jeon et al. |
| 2020/0267828 A1 | 8/2020 | Moon et al. |
| 2021/0385941 A1 | 12/2021 | Park |
| 2021/0410268 A1 | 12/2021 | Moon et al. |
| 2022/0151067 A1 | 5/2022 | Koo et al. |
| 2023/0221770 A1 | 7/2023 | Heo et al. |

FOREIGN PATENT DOCUMENTS

| | | |
|---|---|---|
| CN | 108633170 A | 10/2018 |
| CN | 211429706 U | 9/2020 |
| CN | 113228603 A | 8/2021 |
| CN | 215379526 U | 12/2021 |
| EP | 0 889 559 A2 | 6/1998 |
| EP | 3 855 875 A1 | 7/2021 |
| JP | 2003-86997 A | 3/2003 |
| JP | 2009-43819 A | 2/2009 |
| JP | 2010-79556 A | 4/2010 |
| JP | 2010-92231 A | 4/2010 |
| JP | 2010-171293 A | 8/2010 |
| KR | 10-2009-0047686 A | 5/2009 |
| KR | 10-2015-0002045 A | 1/2015 |
| KR | 10-1496173 B1 | 2/2015 |
| WO | 2017/186045 A1 | 11/2017 |
| WO | 2022/065806 A1 | 3/2022 |

OTHER PUBLICATIONS

Communication dated Aug. 22, 2023, issued by the International Searching Authority in counterpart International Application No. PCT/KR2023/006316 (PCT/ISA/210 and PCT/ISA/237).

Communication issued on Mar. 17, 2025 by the European Patent Office for European Patent Application No. 23803826.9.

* cited by examiner

ELECTRONIC DEVICE

CROSS REFERENCE TO RELATED APPLICATION

This application is a bypass continuation of International Application PCT/KR2023/006316, filed on May 10, 2023, which is based on and claims priority to CN Patent Application No. CN202210520692.7 filed on May 13, 2022, the disclosures of which are all hereby incorporated herein by reference in their entireties.

BACKGROUND

1. Field

The disclosure generally relates to an electronic device, and in particular, an electronic device integrated with additional modules.

2. Description of the Related Art

There are various kinds of electronic devices, such as tablet computers, portable communication devices, and portable media players. As mobile communication technology has developed, electronic devices have been introduced to the market that include at least one communication module. These electronic devices may transmit and/or receive radio frequency (RF) signals such as voice signals or data (e.g., message, photo, moving picture, music file, or game) by using the communication module. These electronic devices typically have wireless communication mechanisms to provide communications between electronic devices, base stations, cell phone towers, and computers. Some common communication mechanisms include IEEE802.11a, b, g, and n (Wi-Fi), World Interoperability for Microwave Access (WiMAX), and cellular mobile communication systems such as Global System For Mobile Communications (GSM) and code division multiple access (CDMA).

In addition, the electronic device may simultaneously transmit or receive signals in different frequency bands, i.e., by using a plurality of frequency bands. The electronic device may provide a service in a global communication band by using the different frequency bands. For example, the electronic device may communicate using signals in a low-frequency band (LB) (e.g., a global positioning system (GPS); Legacy; WiFi1) and/or communication (e.g., WiFi2) using signals in a high-frequency band (HB).

SUMMARY

According to an aspect of the disclosure, there is provided a compact electronic device integrated with additional modules.

According to an aspect of the disclosure, there is provided an electronic device including: an upper housing and a lower housing; a first circuit board, a second circuit board, and a supporting member connected between the first circuit board and the second circuit board, wherein the supporting member is provided between the upper housing and the lower housing, wherein the supporting member includes: a first installation surface, a second installation surface, and a bending portion connected between the first installation surface and the second installation surface, wherein the first installation surface is located lower than the second installation surface, wherein the first circuit board is provided on the first installation surface, wherein a connecting part is provided on the first circuit board, wherein the connecting part is configured to fix the first circuit board to the first installation surface, and wherein the second circuit board is fixed to the second installation surface, and wherein the lower housing is connected to the connecting part.

The lower surface of the upper housing may be provided with a keyboard module, and the supporting member is provided between the lower housing and the keyboard module.

The first installation surface and the second installation surface may be configured to extend away from each other with a width decreasing toward a direction away from the bending portion.

The first installation surface may include a sidewall structure protruding toward the keyboard module.

The first installation surface may include a position-setting rib, which is provided facing the first circuit board for inserting the first circuit board.

The first installation surface may have a circular shape.

The first installation surface may include a first through-hole.

The first circuit board may include an L-shaped notch, and a substantial portion of the supporting member is housed in the L-shaped notch.

The first circuit board may have a top surface and a bottom surface, and wherein the first circuit board may include a second through-hole.

The first circuit board may include a plurality of guiding holes located proximate to the outer edges of the second through-hole, and each of the guiding holes configured to receive a position-setting rib to permit mounting of the supporting member.

The connecting part may include a threaded hole.

The supporting member may be located relative to the first circuit board so that the first through-hole of the first installation surface cooperates with the second through-hole of the first circuit board to permit passage of a fixing screw which fasted on the threaded hole of the connecting part therethrough.

The connecting part may be provided above the first circuit board and is separated from the first circuit board by a slit, and the second circuit board has a movable cable extending outward, and the movable cable is fixed in a gap between the first circuit board and the second circuit board.

The lower housing may have a hook body protruding upward to be buckled to the connecting part.

The second installation surface may be provided with a nut seat, and the second circuit board is connected to the nut seat by a screw.

BRIEF DESCRIPTION OF DRAWINGS

One or more aspects and advantages of the disclosure will become clear from the following detailed description taken in conjunction with the accompanying drawings, which illustrate, by way of example, the principles of the disclosure.

DETAILED DESCRIPTION

All terms including descriptive or technical terms which are used herein should be construed as having meanings that are understood to one of ordinary skill in the art. However, the terms may have different meanings according to an intention of one of ordinary skill in the art, precedent cases, or the appearance of new technologies. In addition, some terms may be selected by the applicant, and in this case, the meaning of the selected terms will be described in detail in the detailed description of embodiments. Thus, the terms used herein have to be defined based on the meaning of the terms together with the description throughout the specification.

Also, when a part "includes" or "comprises" an element, unless there is a particular description contrary thereto, the part may further include other elements, not excluding the other elements. In the following description, terms such as "unit" and "module" indicate a unit for processing at least one function or operation, wherein the unit and the block may be embodied as hardware or software or embodied by combining hardware and software.

The embodiments will now be described more fully with reference to the accompanying drawings. However, the embodiments may be embodied in many different forms, and should not be construed as being limited to the embodiments set forth herein. Rather, these embodiments are provided so that this disclosure will be thorough and complete, and will fully convey the concept of the embodiments to one of ordinary skill in the art. In the following description, well-known functions or constructions are not described in detail because they would obscure the embodiments with unnecessary detail, and like reference numerals in the drawings denote like or similar elements throughout the specification.

Figure 1:
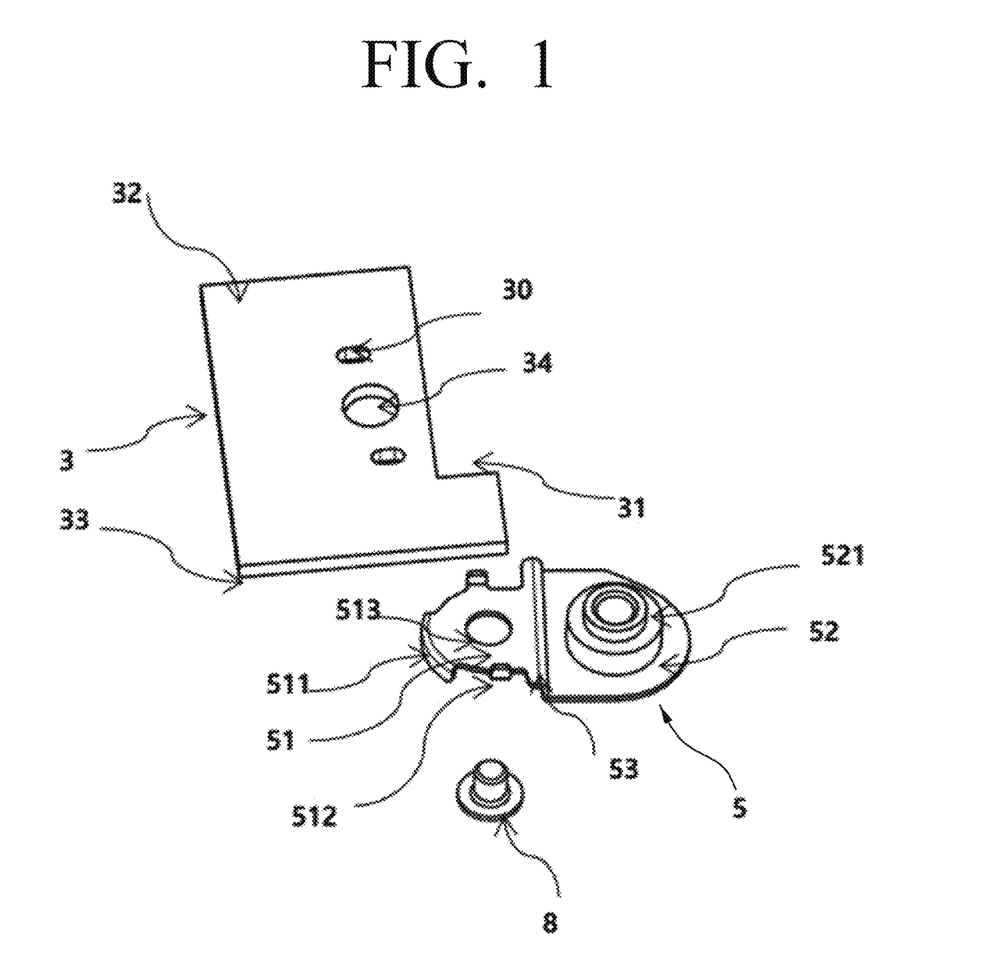
FIG. 1 is an explosive view showing a first part of an electronic device according to an example embodiment the disclosure.
Figure 2:
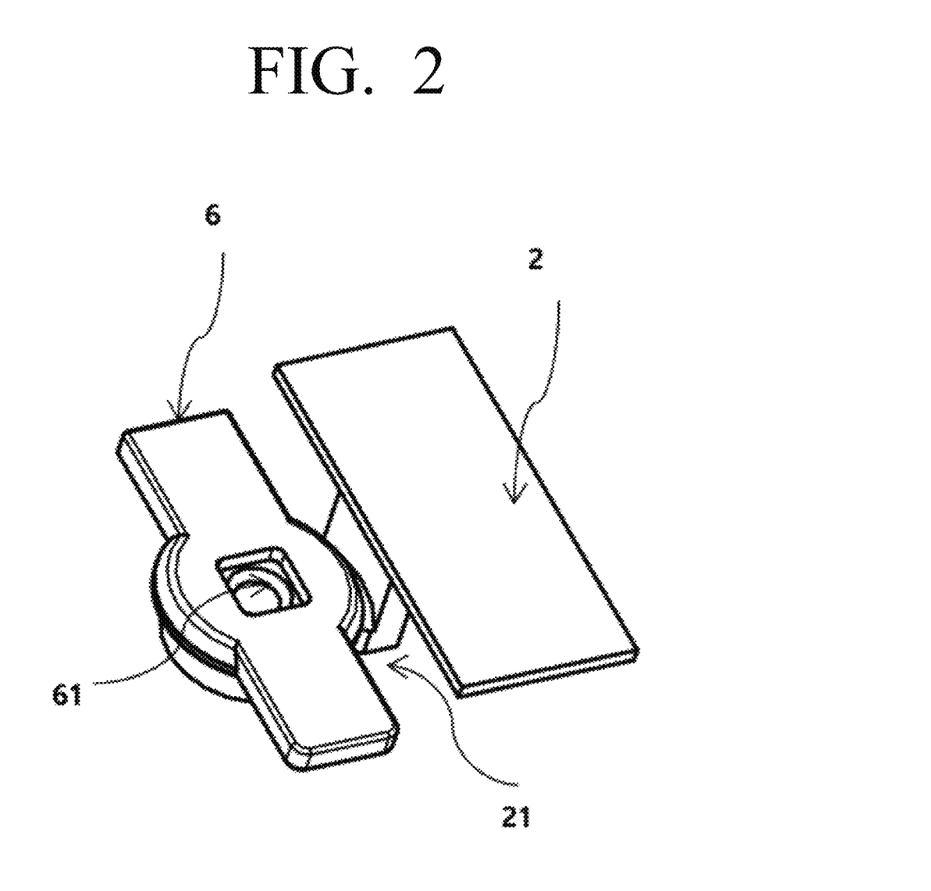
FIG. 2 is a schematic view showing a second part of the electronic device according to an example embodiment the disclosure.
Figure 3:
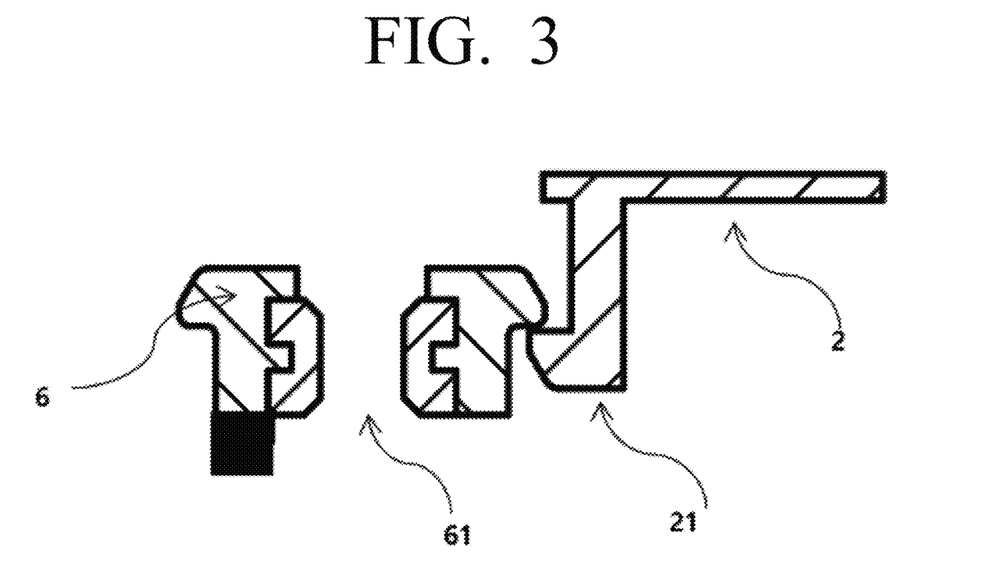
FIG. 3 is a cross-sectional view of FIG. 2.
Figure 4:
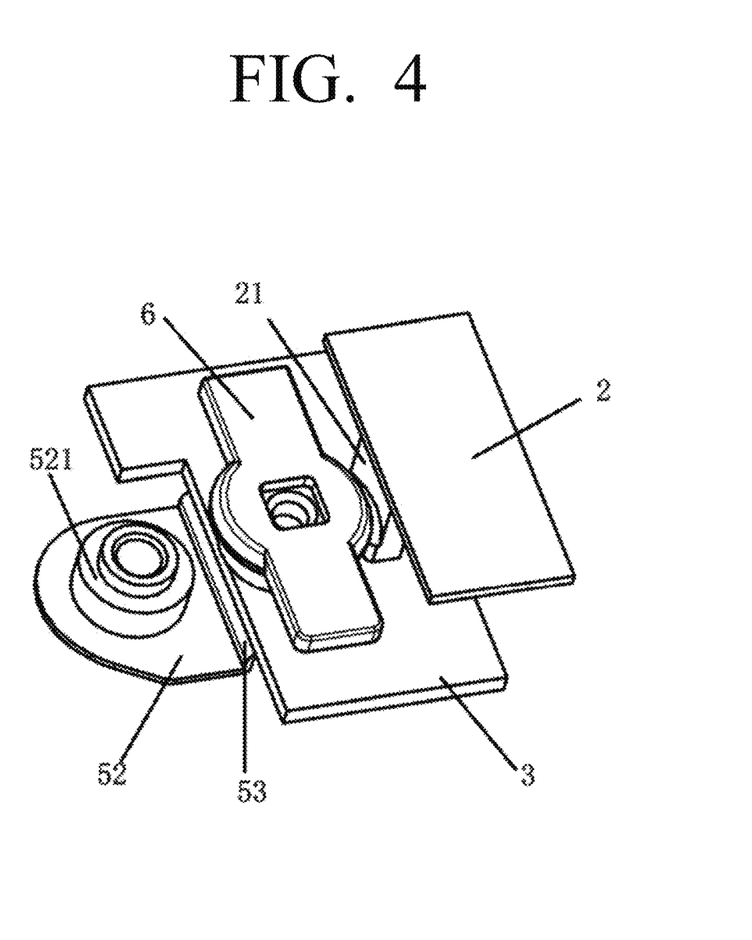
FIG. 4 is an assembly view showing the first part and the second part of the electronic devices according to an example embodiment the disclosure.
Figure 5:
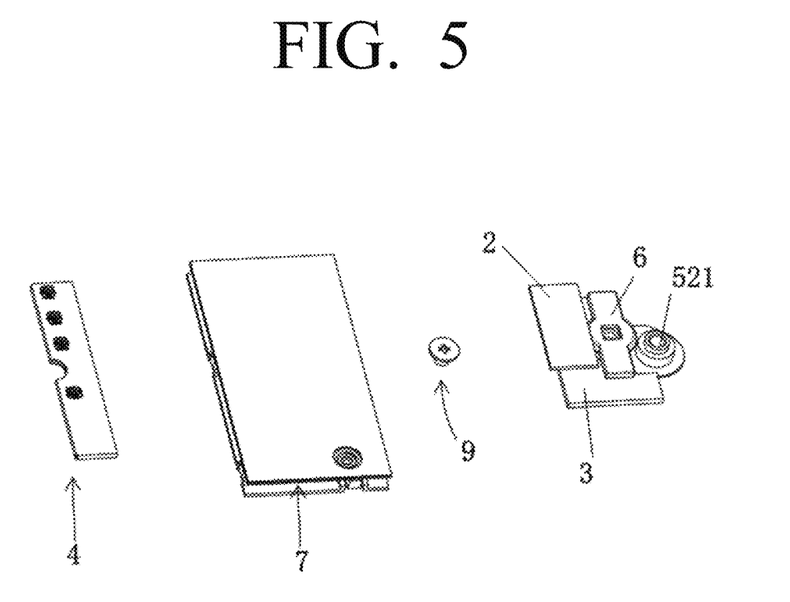
FIG. 5 is an explosive view showing the first part, the second part, and a third part of the electronic devices according to an example embodiment the disclosure.
Figure 6:
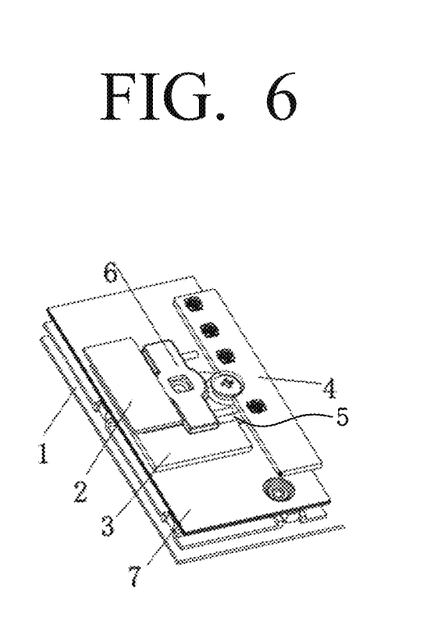
FIG. 6 is an assembly view showing the first part, the second part, and the third part of the electronic devices according to an example embodiment the disclosure.

Hereinafter, embodiments of the disclosure will be described in detail with reference to the accompanying drawings. FIG. 1 is an explosive view showing a first part of the electronic devices according to an example embodiment the disclosure. FIG. 2 is a schematic view showing a second part of the electronic devices according to an example embodiment the disclosure. FIG. 3 is a cross-sectional view of FIG. 2. FIG. 4 is an assembly view showing the first part and the second part of the electronic devices according to an example embodiment the disclosure. FIG. 5 is an explosive view showing the first part, the second part, and a third part of the electronic devices according to an example embodiment the disclosure. FIG. 6 is an assembly view showing the first part, the second part, and the third part of the electronic devices according to an example embodiment the disclosure.

According to an example embodiment, the electronic device may include a portable communication device (e.g., a smartphone), a computer (e.g., a notebook), a portable multimedia device, a portable medical device, a camera, a wearable device, or a home appliance. Referring to FIG. 6, the electronic device may include an upper housing 1 and a lower housing 2. The electronic device may further include a first circuit board 3, a second circuit board 4, and a supporting member 5 connected between the first circuit board 3 and the second circuit board 4. The supporting member 5 may be provided between the upper housing 1 and the lower housing 2. Referring to FIG. 1, the supporting member 5 has a first installation surface 51, a second installation surface 52, and a bending portion 53 connected between the first installation surface 51 and the second installation surface 52. According to an example embodiment, the first installation surface 51 is located below the second installation surface 52. The first circuit board 3 is provided on the first installation surface 51.

Referring to FIGS. 2 and 5, the electronic device may include a connecting part 6 provided on the first circuit board 3. According to an example embodiment, the first circuit board 3 is fixed to the first installation surface 51 by the connecting part 6, and the second circuit board 4 is fixed to the second installation surface 52. The lower housing 2 is connected to the connecting part 6. The lower surface of the upper housing 1 is provided with a keyboard module 7, and the supporting member 5 is provided between the lower housing 2 and the keyboard module 7.

The second circuit board 4 is configured to complete the preset communication function, such as packet parsing, data transmitting, and data receiving. The communication module may support establishing a direct communication channel or a wireless communication channel between the electronic device and the external electronic device and performing communication via the established communication channel. The communication module may include one or more communication processors that are operable independently from the processor and support a direct communication or a wireless communication. According to an embodiment, the communication module may include a wireless communication module (e.g., a cellular communication module, a short-range wireless communication module, or a global navigation satellite system (GNSS) communication module) or a wired communication module (e.g., a local area network (LAN) communication module or a power line communication (PLC) module). A corresponding one of these communication modules may communicate with the external electronic device via the first network (e.g., a short-range communication network, such as Bluetooth™, wireless-fidelity (Wi-Fi) direct, or infrared data association (IrDA)) or the second network (e.g., a long-range communication network, such as a legacy cellular network, a 5G network, the Internet, or a computer network (e.g., LAN or wide area network (WAN)). These various types of communication modules may be implemented as a single component (e.g., a single chip), or may be implemented as multi-components (e.g., multi chips) separate from each other. The wireless communication module may identify and authenticate the electronic device in a communication network, such as the first network or the second network, using subscriber information (e.g., international mobile subscriber identity (IMSI)) stored in the subscriber identification module.

Referring to FIG. 1, the first installation surface 51 and the second installation surface 52 are configured to extend away from each other with the width decreasing toward the direction away from the bending portion. The bending portion 53 has a first width, and the first installation surface 51 has a second width less than the first width, and the second installation surface 52 has a third width less than the first width. The first installation surface 51 has a sidewall structure 511 protruding toward the keyboard module 7. The first installation surface 51 includes a position-setting rib 512 which is provided facing the first circuit board 3 direction for inserting the first circuit board 3. The first installation surface 51 has a generally circular shape. The first installation surface 51 is structured to include a first through-hole 513.

The first circuit board includes an L-shaped notch 31 for locating the supporting member 5 in both X and Y directions, and a substantial portion of the supporting member 5 is housed in the L-shaped notch 31. The first circuit board 3 has a top surface 32 and a bottom surface 33, and is structured to include a second through-hole 34. The first circuit board 3 includes a plurality of guiding holes 35 located proximate to the outer edges of the second through-hole 34, and each of the guiding holes 35 is sized to receive a position-setting rib 512 to permit mounting of the supporting member 5.

The connecting part 6 is structured to include a threaded hole 61. The supporting member 5 is located relative to the first circuit board 3 so that the first through-hole 513 of the first installation surface 51 cooperates with the second through-hole 34 of the first circuit board 3 to permit passage of a fixing screw 8 which fasted on the threaded hole 61 of the connecting part 6 therethrough. The connecting part 6 is provided above the first circuit board 3 and is separated from the first circuit board 3 by a slit, and the second circuit board 4 has a movable cable 41 extending outward, and the movable cable 41 is fixed in a gap between the first circuit board 3 and the second circuit board 4. The second installation surface 52 is provided with a nut seat 521, and the second circuit board 4 is connected to the nut seat 521 by a screw 9. The lower housing 2 has a hook body 21 protruding upward to be buckled to the connecting part 6.

The second circuit board 4 may implement different communication functions by disposing different daughter boards. It should be noted that the communication function implemented by the target board in the foregoing embodiment may be implemented by a processor executing a corresponding software instruction. The software instruction may include a corresponding software module. The software module may be stored in a random access memory (RAM), a flash memory, a read-only memory (ROM), an erasable programmable read-only memory (EPROM), an electrically erasable programmable read-only memory (EEPROM), a register, a hard disk, a removable hard disk, a compact disc read-only memory (CD-ROM), or a storage medium in any other forms well-known in the art. A storage medium used as an example is coupled to the processor, so that the processor can read information from the storage medium, and can write information into the storage medium. Certainly, the storage medium may be a part of the processor. This is not limited to this embodiment of the disclosure.

In addition, the communications module of the second circuit board 4 may be a chip, a processor, or a functional module having a particular function. The processor may be a central processing unit (CPU), a general-purpose processor, a digital signal processor (DSP), an application-specific integrated circuit (ASIC), a field programmable gate array (FPGA), or another programmable logic device, a transistor logic device, a hardware component, or any combination thereof. The processor may implement or execute various examples of logical blocks, modules, and circuits that are described with reference to the contents disclosed in the disclosure. The processor may also be a combination of computing functions, for example, includes a combination of one or more microprocessors or a combination of a digital signal processor (DSP) and a microprocessor. This is not limited to this embodiment of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. An electronic device comprising:
an upper housing and a lower housing;
a first circuit board,
a second circuit board, and
a supporting member connected between the first circuit board and the second circuit board,
wherein the supporting member is provided between the upper housing and the lower housing,
wherein the supporting member comprises:
 a first installation surface,
 a second installation surface, and
 a bending portion connected between the first installation surface and the second installation surface,
wherein the first installation surface is located lower than the second installation surface,
wherein the first circuit board is provided on the first installation surface,
wherein a connecting part is provided on the first circuit board,
wherein the connecting part is configured to fix the first circuit board to the first installation surface, and
wherein the second circuit board is fixed to the second installation surface, and
wherein the lower housing is connected to the connecting part.

2. The electronic device of claim 1, wherein the lower surface of the upper housing is provided with a keyboard module, and the supporting member is provided between the lower housing and the keyboard module.

3. The electronic device of claim 2, wherein the first installation surface and the second installation surface are configured to extend away from each other with a width decreasing toward a direction away from the bending portion.

4. The electronic device of claim 2, wherein the first installation surface comprises a sidewall structure protruding toward the keyboard module.

5. The electronic device of claim 2, wherein the first installation surface comprises a position-setting rib, which is provided facing the first circuit board for inserting the first circuit board.

6. The electronic device of claim 2, wherein the first installation surface has a circular shape.

7. The electronic device of claim 2, wherein the first installation surface comprises a first through-hole.

8. The electronic device of claim 7, wherein, the first circuit board comprises an L-shaped notch, and a substantial portion of the supporting member is housed in the L-shaped notch.

9. The electronic device of claim 7, wherein, the first circuit board has a top surface and a bottom surface, and
wherein the first circuit board comprises a second through-hole.

10. The electronic device of claim 9, wherein the first circuit board comprises a plurality of guiding holes located proximate to the outer edges of the second through-hole, and each of the guiding holes configured to receive a position-setting rib to permit mounting of the supporting member.

11. The electronic device of claim 10, wherein the connecting part comprises a threaded hole.

12. The electronic device of claim 11, wherein the supporting member is located relative to the first circuit board so that the first through-hole of the first installation surface cooperates with the second through-hole of the first circuit board to permit passage of a fixing screw which fasted on the threaded hole of the connecting part therethrough.

13. The electronic device of claim 11, wherein the connecting part is provided above the first circuit board and is separated from the first circuit board by a slit, and the second circuit board has a movable cable extending outward, and the movable cable is fixed in a gap between the first circuit board and the second circuit board.

14. The electronic device of claim 13, wherein the lower housing has a hook body protruding upward to be buckled to the connecting part.

15. The electronic device of claim 13, wherein the second installation surface is provided with a nut seat, and the second circuit board is connected to the nut seat by a screw.

* * * * *